(12) United States Patent
Parkhe et al.

(10) Patent No.: US 11,794,441 B2
(45) Date of Patent: Oct. 24, 2023

(54) BONDING STRUCTURE OF E CHUCK TO ALUMINUM BASE CONFIGURATION

(71) Applicant: Applied Materials, Inc., Santa Clara, CA (US)

(72) Inventors: Vijay D. Parkhe, San Jose, CA (US); Roger Alan Lindley, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 17/523,973

(22) Filed: Nov. 11, 2021

(65) Prior Publication Data

US 2022/0063236 A1     Mar. 3, 2022

Related U.S. Application Data

(62) Division of application No. 16/876,326, filed on May 18, 2020, now Pat. No. 11,192,323, which is a
(Continued)

(51) Int. Cl.
*B32B 3/24* (2006.01)
*B32B 3/26* (2006.01)
(Continued)

(52) U.S. Cl.
CPC ............... *B32B 3/266* (2013.01); *B32B 5/18* (2013.01); *B32B 7/12* (2013.01); *H01L 21/6833* (2013.01);
(Continued)

(58) Field of Classification Search
CPC .................................................... B32B 3/266
See application file for complete search history.

(56) References Cited

U.S. PATENT DOCUMENTS 6,490,144 B1   12/2002   Narendrnath et al.
8,449,786 B2    5/2013   Larson et al.
(Continued)

FOREIGN PATENT DOCUMENTS

JP    2011151336 A    8/2011
JP    2014139989 A    7/2014
(Continued)

OTHER PUBLICATIONS

Japanese Office Action dated Aug. 16, 2022, for Japanese Patent Application No. 2018136555.
(Continued)

*Primary Examiner* — William P Watkins, III
(74) *Attorney, Agent, or Firm* — Patterson + Sheridan, LLP

(57) ABSTRACT

The present disclosure is a method of bonding an electrostatic chuck to a temperature control base. According to the embodiments, a bonding layer is formed between a dielectric body comprising the electrostatic chuck and a temperature control base. A flow aperture extends through the dielectric body and is aligned with a flow aperture in the temperature control base. The bonding layer is also configured with an opening that aligns with apertures in the dielectric body and the temperature control base. In one aspect, a porous plug may be disposed within the flow aperture to protect the bonding layer. In another aspect, a seal is disposed within the flow aperture to seal off the boding layer from gases in the flow aperture.

20 Claims, 4 Drawing Sheets

Related U.S. Application Data division of application No. 15/724,045, filed on Oct. 3, 2017, now Pat. No. 10,688,750.

(51) Int. Cl.
 *B32B 5/18* (2006.01)
 *H01L 21/683* (2006.01)
 *H01L 21/687* (2006.01)
 *B32B 7/12* (2006.01)

(52) U.S. Cl.
 CPC .. *H01L 21/68757* (2013.01); *H01L 21/68785* (2013.01); *Y10T 428/24273* (2015.01); *Y10T 428/24322* (2015.01); *Y10T 428/24339* (2015.01)

(56) References Cited

U.S. PATENT DOCUMENTS

| | | | |
|---|---|---|---|
| 9,627,240 | B2 | 4/2017 | Yamaguchi et al. |
| 9,685,356 | B2 | 6/2017 | Parkhe et al. |
| 9,960,067 | B2 | 5/2018 | Anada et al. |
| 10,688,750 | B2 | 6/2020 | Parkhe et al. |
| 2010/0156054 | A1 | 6/2010 | Sun et al. |
| 2011/0272899 | A1 | 11/2011 | Shimazu |
| 2013/0088808 | A1 | 4/2013 | Parkhe et al. |
| 2014/0202618 | A1 | 7/2014 | Hayashi |
| 2014/0301010 | A1 | 10/2014 | Hayahara et al. |
| 2014/0376148 | A1 | 12/2014 | Sasaki et al. |
| 2015/0279714 | A1 | 10/2015 | Yamaguchi et al. |
| 2016/0276196 | A1 | 9/2016 | Parkhe |
| 2016/0352260 | A1 | 12/2016 | Comendant |
| 2017/0243726 | A1 | 8/2017 | Kellogg |
| 2017/0256431 | A1 | 9/2017 | Parkhe |
| 2018/0025933 | A1 | 1/2018 | Ishimura et al. |
| 2018/0090361 | A1 | 3/2018 | Sasaki et al. |
| 2019/0267277 | A1 | 8/2019 | Sasaki et al. |

FOREIGN PATENT DOCUMENTS

| | | |
|---|---|---|
| JP | 2015195346 A | 11/2015 |
| JP | 6110159 B2 | 4/2017 |
| WO | 2013047555 A1 | 4/2013 |

OTHER PUBLICATIONS

6110159, JP, International Search Report and Written Opinion for Application No. PCT/US2019/018589 (APPM/44014957WO) dated May 31, 2019.

International Search Report and Written Opinion for Application No. PCT/US2019/018589 (APPM/44014957WO) dated May 31, 2019.

Korean Office Action dated May 31, 2023 for Application No. 10-2018-0117680, together with a concise statement of relevance in lieu of English translation.

Office Action from Japanese Patent Application No. 2018-136555 dated Feb. 21, 2023.

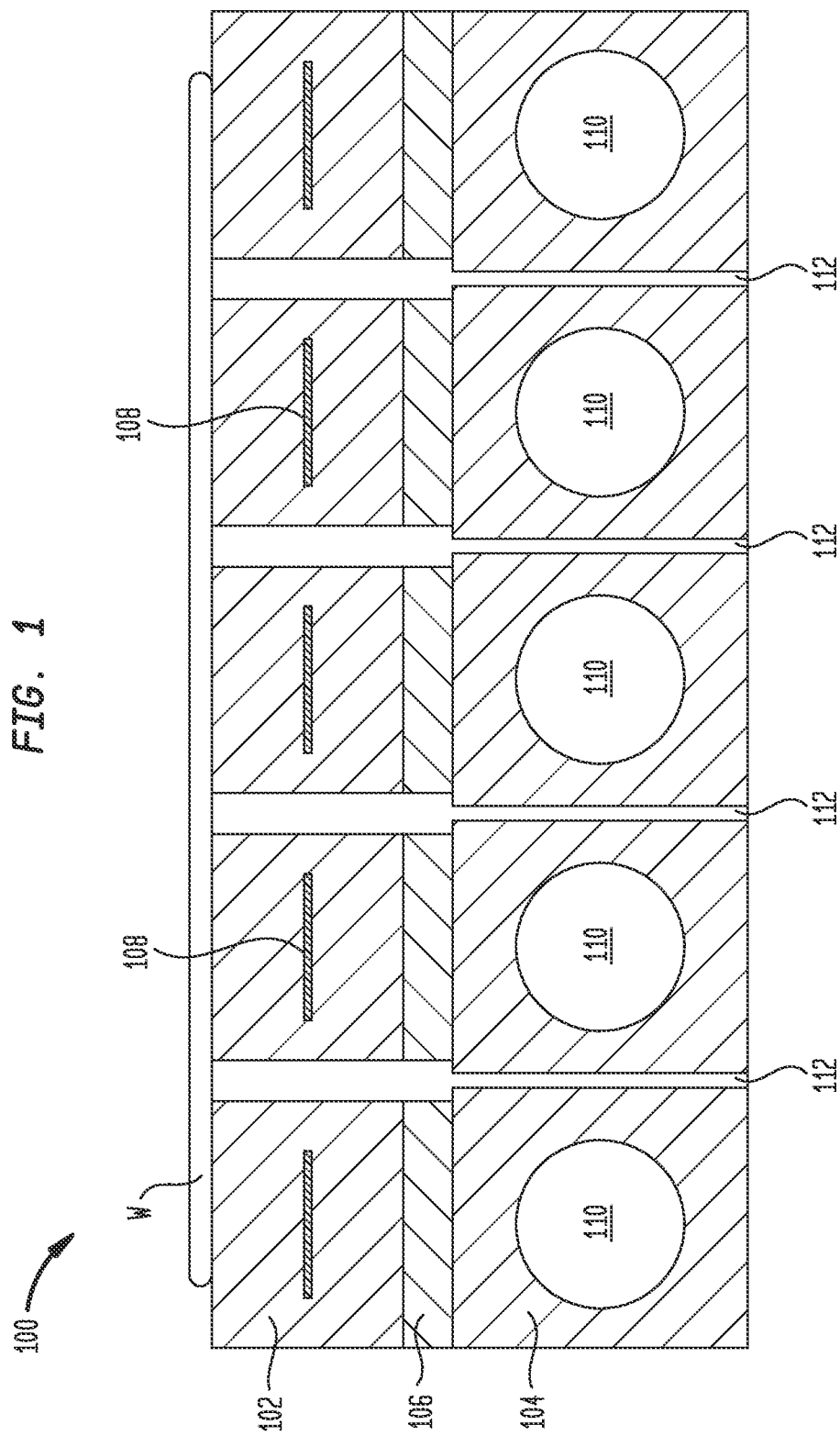

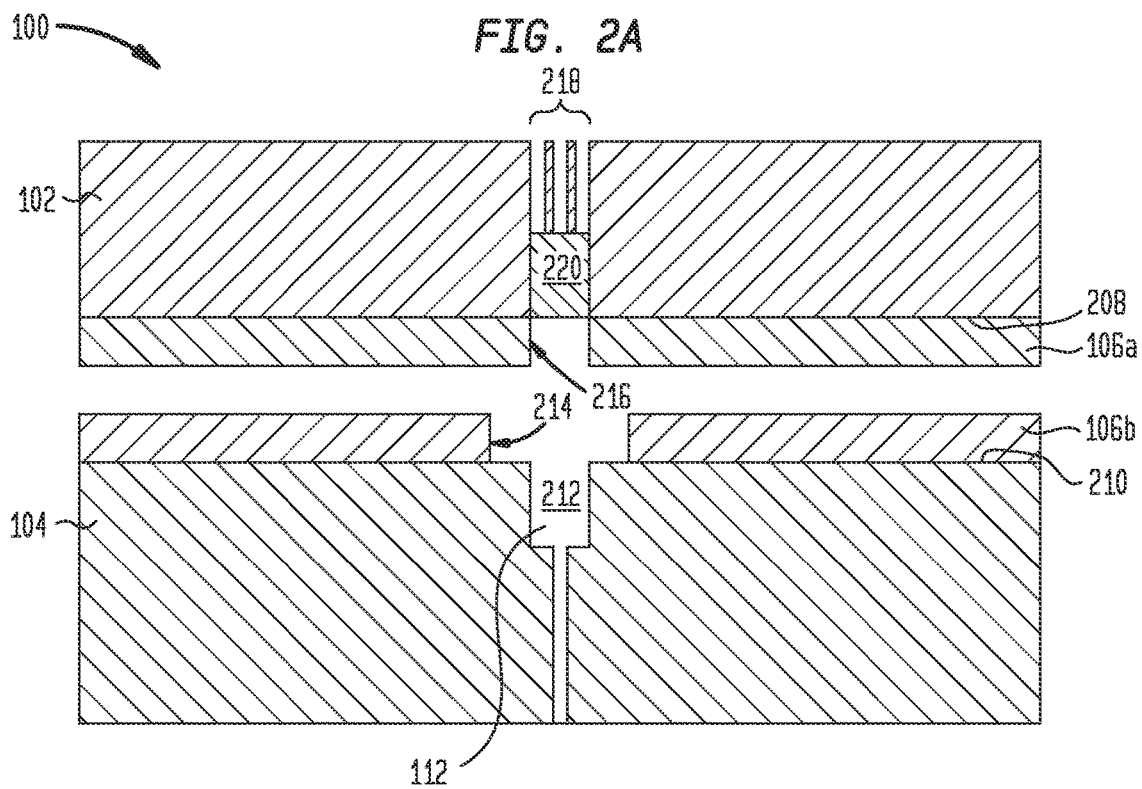
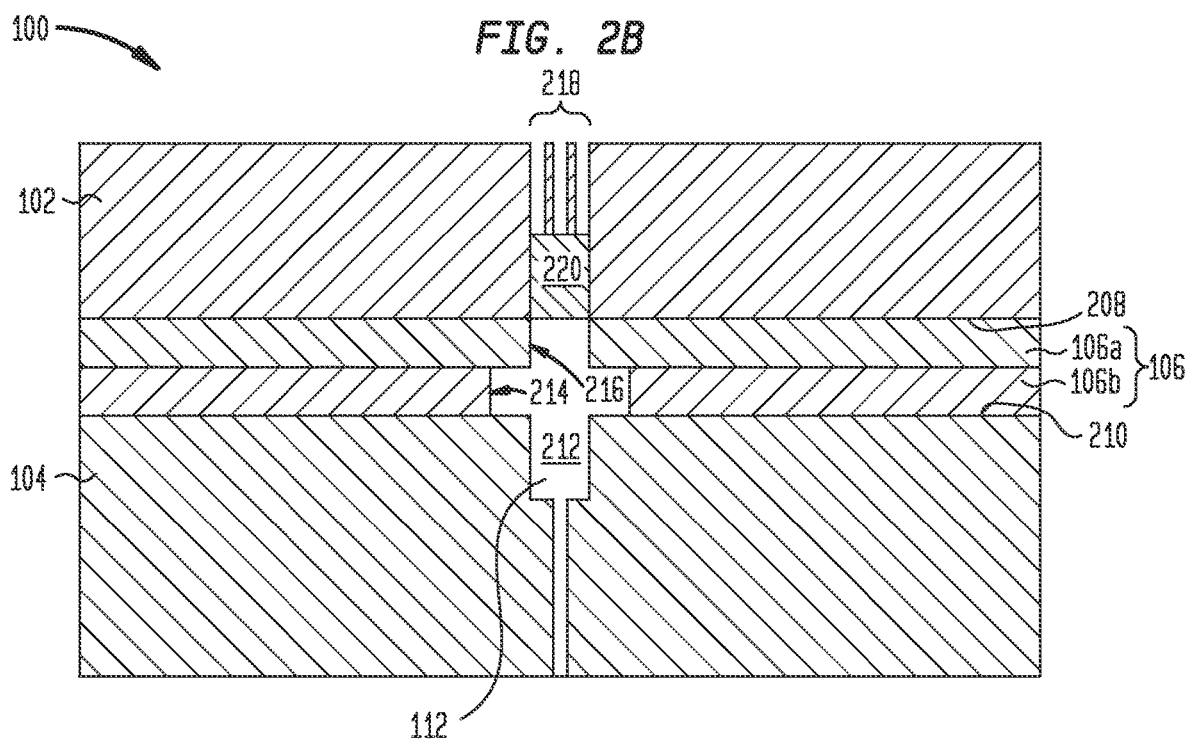

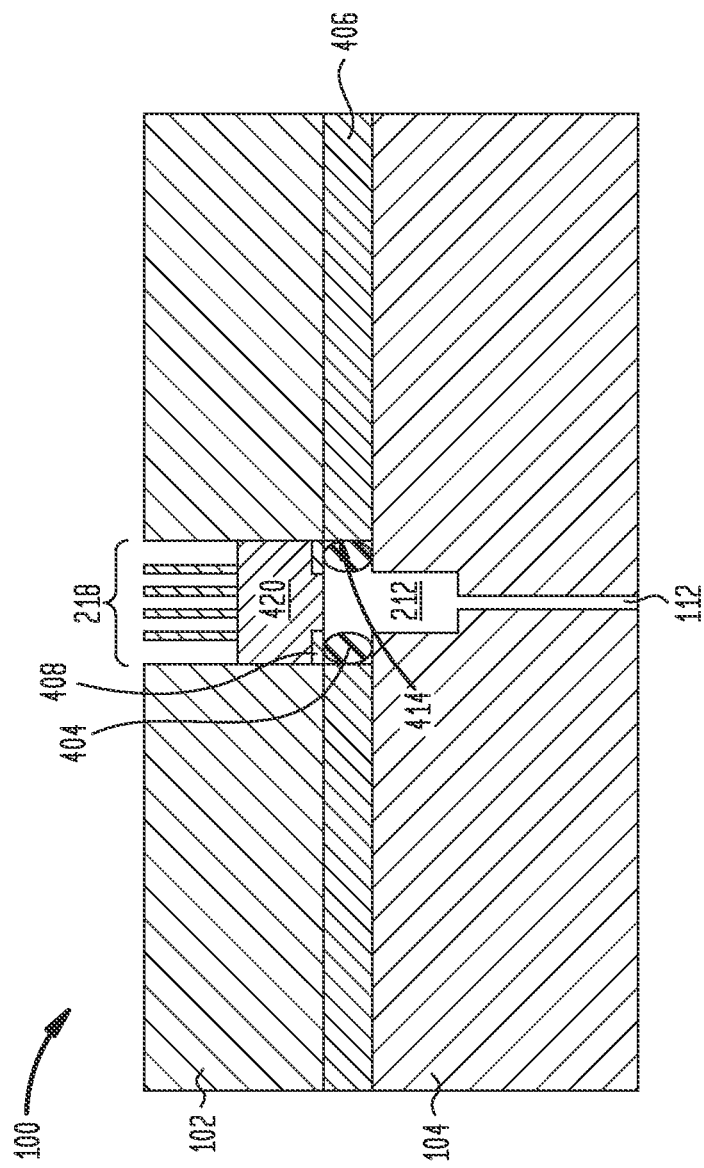

BONDING STRUCTURE OF E CHUCK TO ALUMINUM BASE CONFIGURATION

CROSS-REFERENCE TO RELATED APPLICATIONS

This application is a divisional of U.S. patent application Ser. No. 16/876,326, filed May 18, 2020, which is a divisional of U.S. patent application Ser. No. 15/724,045, filed Oct. 3, 2017, which are all hereby incorporated by reference in their entirety.

BACKGROUND

Field

Embodiments of the present disclosure generally relate to a bonding layer for an electrostatic chuck.

Description of the Related Art

Electrostatic chucks are utilized in a variety of manufacturing and processing operations. In semiconductor manufacturing, electrostatic chucks are commonly used to support a substrate in a processing chamber. Semiconductor manufacturing exposes the substrate support, which contains the electrostatic chuck, to the processing chamber environment and a range of temperatures between ambient and substrate process temperature. In order to maintain the temperature of the substrate at a desired setpoint, the electrostatic chuck, which is formed from a ceramic, is coupled to a temperature control base. A conductive bonding material between the ceramic chuck portion and the temperature control base connects these two bodies.

The substrate support, including the bonding material exposed at the interface between the electrostatic chuck and the cooling base at any backside gas passages extending therethrough, is exposed to the process gases and process reaction byproducts of the manufacturing process. Some of these gases and byproducts, if they come into contact with the bonding material, can deteriorate the bonding material. Inconsistencies in the bonding material also result during the fabrication and forming thereof. These variations in adhesion strength and material properties can result in delamination of the bonding material from the electrostatic chuck and the temperature control base or locally change the heat transfer through the binding material, resulting in temperature variations across the chucking surface of the electrostatic chuck. Further, the electrostatic chuck and the temperature control base may have different coefficients of thermal expansion. When the temperature of the substrate support increases, such as during process operations, or when the dielectric body and the temperature control base have different temperatures, the stress in the bonding material increases due to the differing thermal expansions of the electrostatic chuck and the temperature control base. This increase in stress can result in localized delamination of the bonding material when local stresses exceed the bonding strength thereof.

SUMMARY

The present disclosure generally relates to a bonding layer for securing a ceramic body to a metallic body. A flow aperture extends through the bodies. A plug and a seal are optionally disposed within the flow aperture to protect the bonding layer. In certain embodiments, the bonding layer may comprise two layers to form a stepped bond profile.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1 is a cross-sectional schematic of an exemplary substrate support.

FIG. 2A-2B is a cross-sectional schematic of a bonding structure securing an electrostatic chuck and a temperature control member together according to one embodiment.

FIG. 4 is a cross-sectional schematic of a bonding structure securing an electrostatic chuck and a temperature control member together according to one embodiment.

Figure 3:
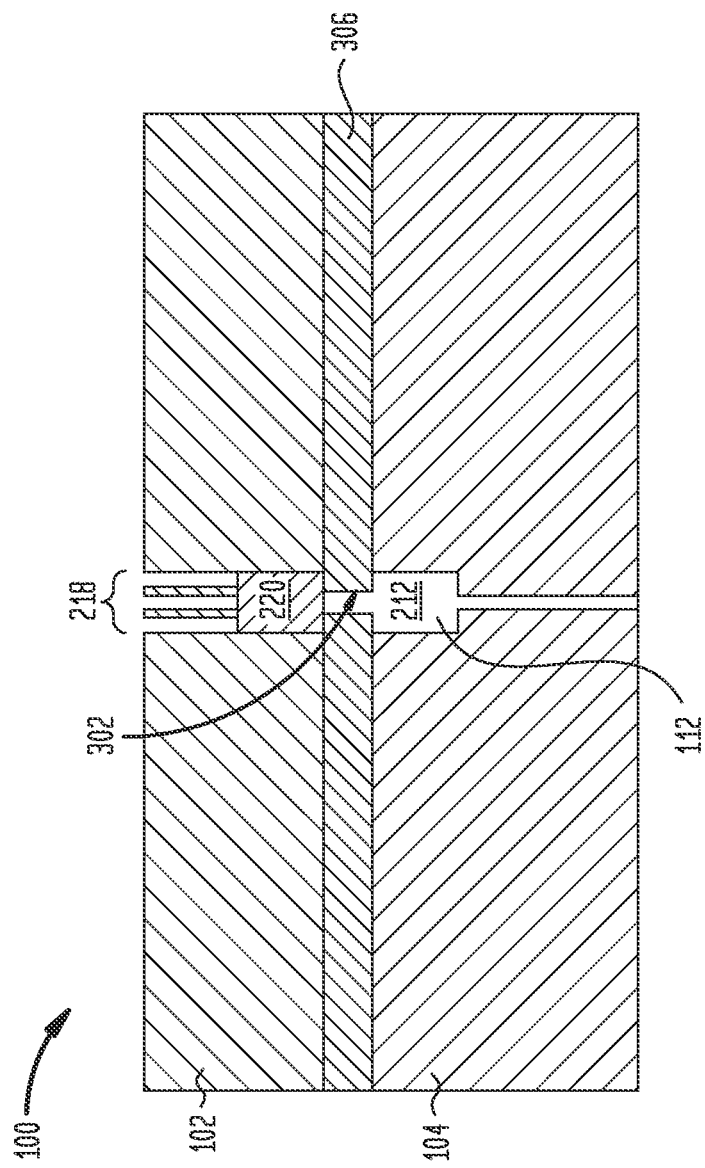
FIG. 3 is a cross-sectional schematic of a bonding structure securing an electrostatic chuck and a temperature control member together according to one embodiment.

To facilitate understanding, identical reference numerals have been used, where possible, to designate identical elements that are common to the figures. It is contemplated that elements and features of one embodiment may be beneficially incorporated in other embodiments without further recitation thereof with respect to the other embodiment.

DETAILED DESCRIPTION

The present disclosure is a method of bonding an electrostatic chuck to a temperature control base. According to the embodiments, a bonding layer is formed between a dielectric body comprising the electrostatic chuck and a temperature control base. A flow aperture extends through the dielectric body and is aligned with a flow aperture in the temperature control base. The bonding layer is configured with an opening that is aligned with the apertures in the dielectric body and the temperature control base. In one aspect, a porous plug may be disposed within the flow aperture to protect the bonding layer from gas present in the flow aperture. In another aspect, a seal is disposed within the flow aperture to seal off the boding layer from gas present in the flow aperture.

FIG. 1 is a schematic cross-sectional view of an exemplary substrate support for use in a processing chamber. The substrate support 100 comprises a dielectric body 102, which forms the electrostatic chuck, and a temperature control base 104. The dielectric body comprises a ceramic material, such as alumina or alumina nitride. The temperature control base 104 comprises a metal such as aluminum. The temperature control base 104 is fixed to a cylindrical support post (not shown) which extends through a wall of a processing chamber to support the substrate support 100 thereon. Alternatively, the temperature control base can be fixed to the base on the interior of the chamber. The substrate support 100 may generally have a circular shape but other shapes, such as rectangular or ovoid, capable of supporting a substrate, may be utilized. A bonding layer 106 is disposed between a lower surface of the dielectric body 102, which faces the temperature control base 104, and an upper surface, opposite of the cylindrical support post of the temperature control base 104, which faces the dielectric body 102. A substrate W is removably disposable on an upper surface of the dielectric body 102 opposite the bonding layer 106. The bonding layer 106 secures, and thermally couples, the dielectric body 102 to the temperature control base 104.

Electrodes 108 are disposed within the dielectric body 102. The electrodes 108 are connected to a power source (not shown) which imposes a voltage on the electrodes to form an electromagnetic field at the interface of the upper surface of the dielectric body 102 and the substrate W. The electromagnetic field interacts with the substrate W to chuck the substrate W to the surface of the dielectric body 102. The electrodes may be biased to provide either a monopolar or a bipolar chuck.

Channels 110 disposed within the temperature control base 104 circulate a fluid through the temperature control base 104. The fluid, typically a liquid such as Galden®, flows from a temperature control unit (not shown) through the channels 110 and back to the temperature control unit. In certain processes, the fluid is used to cool the temperature control base 104 in order to lower the temperature of the dielectric body 102 and substrate W disposed thereon. Conversely, the fluid may be used to elevate temperature of the temperature control base 104 to heat the dielectric body 102 and substrate W thereon. In other embodiments, resistive heaters (not shown) may be disposed within the temperature control base. In some cases, heat from the resistive heaters, in combination with heat transfer from the temperature control base 104 into the fluid, is used to maintain the dielectric body 102 or the substrate W at a setpoint temperature.

Flow apertures 112 are disposed within the substrate support 100. As shown in FIG. 1, the flow apertures 112 are formed to extend though the dielectric body 102, the bonding layer 106, and the temperature control base 104. In this configuration, gas introduced through the flow apertures 112 is present in the region between the side of the substrate W which faces the dielectric body 102 and the facing surface of the dielectric body 102. The gas is maintained at a pressure sufficient to cause the gas to serve as a heat conduction path between the substrate W and the dielectric body 102. A gas source (not shown) is coupled to the flow apertures 112. During processing, a gas such as helium flows from the gas source and is delivered to the lower surface of substrate W (the surface not exposed to the processing area of the chamber) via the flow apertures 112. Some gases are known to degrade the boding layer 106 that is exposed to the gas at the flow apertures 112.

FIG. 2A and FIG. 2B are cross-sectional schematic views of a dielectric body 102, a temperature control base 104, and an intermediate bonding layer 106. In FIGS. 2A-2B, substrate support 100 comprises a dielectric body 102 and temperature control base 104 like those of FIG. 1. Here, the bonding layer 106 comprises a two part layer 106a, 106b. In the embodiment of FIGS. 2A-2B, bonding layers 106a, 106b comprise sheets of a bonding material. The bonding layers 106a, 106b comprise an organic material such as silicone, acrylic, perfluoro polymer, or combinations thereof, but other materials are contemplated. In certain embodiments, the bonding layer 306 additionally comprises inorganic materials, for example alumina, aluminum nitride, or silicon carbide, to improve specific properties of the bonding layer 306 such as thermal conductivity. Bonding layer 106a is disposed on a surface 208 of the dielectric body 102. Bonding layer 106b is disposed on a facing surface 210 of the temperature control base 104. The bonding layers 106a, 106b are adhered to the dielectric body 102 and temperature control base 104, respectively, (FIG. 2A) before forming the completed bonding layer 106 therewith (FIG. 2B), which improves the bonding properties of, and increases the uniformity of the thickness of, the bonding material. The final bonding layer 106 is formed by a curing process. The bonding layer 106 may have a thickness in a range of about 100 micrometers to 800 micrometers but may also be thicker or thinner as necessary to achieve desire material properties, bonding strength, and heat transfer properties between the dielectric body 102 and the temperature control base 104. Though sheets of bonding material are used in FIGS. 2A-2B, it is understood that any method capable of forming the bonding layers may be used, such as casting, applying a paste, spraying or molding the bonding material on the respective dielectric body 102 and temperature control base 104 surfaces. Additionally, a different number of layers may be used to form the bonding layer 106

The flow aperture 112 extends through the substrate support 100. One flow aperture is shown in FIGS. 2A-2B for ease of description but it is understood that multiple apertures may be utilized. The flow aperture 112 is formed though the dielectric body 102, the bonding layer 106, and the temperature control base 104. The portion of the flow aperture 112 disposed within the temperature control base 104 comprises two portions. The first portion extends inwardly toward the center of the body of the temperature control base 104 from surface 210 facing the dielectric body 102. The first portion, which extends partially through the temperature control base 104, is a counterbore forming a cylindrical recess 212. The second portion extends from the recess 212 through the remainder of the temperature control base 104, and has a circular cross-section. The first portion and the second portion each have a diameter wherein the diameter of the second portion is less than the diameter of the first portion, as shown in FIGS. 2A-2B. The bonding layer 106 is disposed adjacent the surface 210 of the temperature control base 104. An opening is formed through each of the bonding layers 106a, 106b and the openings are aligned with the center of the recess 212, forming apertures through each bonding layer 106a, 106b. The opening 214 of bonding layer 106b has a diameter that is equal to or greater than the diameter of recess 212. Opening 216 of bonding layer 106a has a diameter less than opening 214. In certain embodiments, the opening 216 may have a diameter substantially equal to the diameter of recess 212. The openings 214, 216 through the bonding layer 106 create a "stepped bond" when the bonding layers 106a, 106b are combined as shown in FIG. 2B.

A series of vanes 218 are formed within the dielectric body 102 and they are configured to align with the recess 212 and openings 214, 216 to partially define the flow aperture 112. Two vanes, defining, in combination with the adjacent sidewall of the dielectric body 102, three passages, are shown in FIGS. 2A-2B but any applicable number of vanes may be practiced with the embodiments herein. A plug 220 is optionally disposed within the dielectric body 102 aligned with flow aperture 112. The plug 220 is formed from a porous material such as a ceramic which may be alumina or zirconia. The plug 220 has a porosity, such as a range of porosity between 10% and 80%, which allows the passage of the gas from the recess 212, through the openings 214, 216 to the passages between the vanes 218 and fluidly communicate with the area between the substrate W when supported on the dielectric body 102, and the dielectric body 102. The plug 220 further prevents particles, ionized particles or ionized gas from passing from the processing area, through the passages between the vanes 218, and into the gas volume area defined by openings 214, 216 when the substrate W is not on the dielectric body 102.

The stepped bond shown in FIGS. 2A-2B advantageously increases the uniformity of the bonding layer due to the forming of two partial layers and then forming the completing bond layer. By increasing the uniformity of the bonding material, the resistance of the bonding material to degradation from exposure to the process gases is increased. Additionally, adhesion is consistent across the bonding layer between the dielectric body and the temperature control base which prevents local delamination due to stresses caused by thermal expansion of one or both of the temperature control base and the dielectric body.

FIG. 3 shows a schematic cross section of a substrate support 100 like that of FIG. 1 and FIGS. 2A-2B. The substrate support 100 of FIG. 3 contains identical components to FIGS. 1-2B which share identical reference numbers and will not be discussed for brevity. A bonding layer 306 is disposed between the dielectric body 102 and the temperature control base 104 securing the dialectic body 102 and the temperature control base 104 together. In the embodiment of FIG. 3, a single sheet of bonding material is used. However, other methods of applying the bonding material, such as casting, applying a paste, spraying or molding, or the use of multiple layers of sheet material, is understood. The bonding layer 306 comprises an organic material such as silicone, acrylic, perfluoro polymer, or combinations thereof, but other materials capable of forming a bond have been contemplated. In certain embodiments, the bonding layer 306 additionally comprises inorganic materials, for example alumina, aluminum nitride, or silicon carbide, to improve specific properties of the bonding layer 306 such as thermal conductivity. An annular opening 302 is formed through the bonding layer 306 and is configured to align with the cylindrical recess 212 and vanes 218 which, in combination with the annular opening 302, partially define the flow aperture 112. Again, a single flow aperture 112 is shown in FIG. 3 but any applicable number of apertures may be utilized. The diameter of opening 302 is smaller than the diameter of the cylindrical recess 212 such that a shoulder is formed by applying the edge of the bonding layer 306 over the recess 212. The shoulder and opening 302 function as a choke for the gas flow to the vanes 218 or plug 220 optionally disposed therein. The opening 302 also has a diameter that is less than the diameter of plug 220 such that the bond layer 306 extends under plug 220 as shown in FIG. 3. Here, the plug 220 is again employed to prevent particles, ionized particles of material or ionized gas from the process environment reaching the bonding material when the substrate W is not present on the dielectric body 102. By extending the bonding layer 306 over recess 212, the surface area of the temperature control base 104 exposed to corrosive process gases is reduced which significantly lessens the corrosion of the metallic temperature control base 104.

FIG. 4 shows a substrate support 100 like that of FIGS. 1-3 and identical components share identical reference numbers. The description of identical components will be neglected again here for brevity. A bonding layer 406 is disposed between, and secures together, dielectric body 102 and temperature control base 104. A single flow aperture 112 is shown disposed in the substrate support 100 but any applicable number may be utilized. An annular opening 414 is formed through the bonding layer 406 to partially define the flow aperture 112. The opening 414 has a diameter substantially larger than the cylindrical recess 212. A seal 404, such as an O-ring, is optionally disposed in the enlarged diameter of the opening 414. The seal 404 functions to seal off the bonding layer 406 from the gas flowing within the flow aperture 112. The seal 404 comprises a material capable of withstanding degradation from the gas chemistry. In certain embodiments, the seal 404 comprises a polymer such as perfluoro polymer (e.g. Viton® or XPE), polytetrafluoroethylene (PTFE), or silicone. Other materials such as additional petroleum based polymers are also contemplated. Any material suitable for contact with the process gas flowing in the flow aperture 112 may be utilized.

A plug 420, similar to plug 220 of FIGS. 2-3, is optionally disposed in the dielectric body 102 adjacent vanes 218. The plug 420 and vanes 218 may be provided in a single piece. The plug 420 comprises a porous material, such as a ceramic, wherein the porosity may have a range, such as 10% to 80% porosity, to allow gas flow through the plug 420 to passages defined by vanes 218 in combination with adjacent sidewalls of the dielectric body 102. Plug 420, like plug 220, is again employed to prevent ionized particles of material and ionized gas from the process environment reaching the bonding material when the substrate W is not present on the dielectric body 102. Plug 420 is configured to receive a ring 408. The ring 408 is disposed adjacent the seal 404 and contacts both seal 404 and plug 420. Ring 408 may comprise a metal or ceramic material. Ring 408 provides an improved sealing surface for seal 404. Seal 404 contacts ring 408 to create a first sealing point. Opposite ring 408, seal 404 contacts the temperature control base 104 to create a second sealing point. The first seal point and second seal point prevent gas from bypassing seal 404 and isolates the bonding layer 406 from gas within the flow aperture 112. The embodiment herein provides improved sealing for protecting bonding layer 406 from process gas, thereby increasing the life and durability of the bonding material.

In certain embodiments, the bonding material of bonding layer 406 can be selected to improve one or more desired properties such as heat transfer or high temperature adhesion. Some materials having the desired properties may conversely have less resistance to deterioration caused by exposure to the process gas within flow aperture 112. By utilizing seal 404 and ring 408 as shown in FIG. 4, the less resistive materials can be selected for the bonding material since the seal 404 isolates bonding layer 406 from the process gas. A second seal (not shown) may be disposed at an outer perimeter of the bonding layer 406 thereby, in combination with seal 404, the dielectric body 102, and temperature control base 104, encapsulate bonding layer 406. Accordingly, a substrate support 100 can have a bonding layer with desirable characteristics without reduction in life and durability of the bonding layer.

It is understood that the embodiments disclosed herein are not limited to electrostatic chucks. The embodiments may be practiced with any structure where a bonding layer is utilized. It is further understood that the exemplary geometries disclosed herein do not limit the scope of the embodiments. Other geometries of flow apertures and bodies have been contemplated.

While the foregoing is directed to embodiments of the present disclosure, other and further embodiments of the disclosure may be devised without departing from the basic scope thereof, and the scope thereof is determined by the claims that follow.

What is claimed is:
1. A bonding layer structure, comprising:
 a first body having a first flow aperture therethrough and an electrode disposed therein;

a second body having second a flow aperture therethrough and a channel disposed therein; and a bonding layer disposed between the first body and the second body, the bonding layer comprising:

a first bonding layer adhering to the first body and having a first opening extending through the first bonding layer; and a second bonding layer directly adhering to the first bonding layer and having a second opening extending through the second bonding layer, wherein the second opening has a second diameter greater than a first diameter of the first opening.

2. The bonding layer structure of claim 1, wherein the first bonding layer and the second bonding layer comprise sheets of a bonding material.

3. The bonding layer structure of claim 1, wherein the bonding layer comprises an organic material.

4. The bonding layer structure of claim 3, wherein the organic material comprises silicone, acrylic, or perfluoro polymer.

5. The bonding layer structure of claim 1, further comprising a porous plug disposed adjacent to the bonding layer.

6. The bonding layer structure of claim 1, wherein centers of the first flow aperture through the first body, the second flow aperture through the second body, the first opening through the first bonding layer, and the second opening through the second bonding layer are aligned along an axis extending therethrough.

7. A bonding layer structure, comprising:

an electrostatic chuck having a first aperture formed therethrough;

a temperature control base having a second aperture formed therethrough;

a bonding layer disposed between the electrostatic chuck and the temperature control base, the bonding layer having a total thickness between about 100 μm and about 800 μm, the bonding layer comprising:

a first bonding layer adhering to the electrostatic chuck and having a first opening extending through the first bonding layer; and a second bonding layer adhering directly to the first bonding layer and having a second opening extending through the second bonding layer, wherein the second opening has a second diameter greater than a first diameter of the first opening; and a porous plug disposed adjacent to the bonding layer.

8. The bonding layer structure of claim 7, wherein the bonding layer comprises an organic material.

9. The bonding layer structure of claim 8, wherein the organic material comprises silicone, acrylic, or perfluoro polymer.

10. The bonding layer structure of claim 7, wherein the second aperture comprises a counterbore forming a cylindrical recess.

11. The bonding layer structure of claim 10, wherein the second diameter of the second opening is equal to or greater than a diameter of the cylindrical recess.

12. The bonding layer structure of claim 7, wherein centers of the first aperture, the second aperture, the first opening, and the second opening are aligned along an axis extending therethrough.

13. The bonding layer structure of claim 7, further comprising a series of vanes formed within the electrostatic chuck and partially defining the first aperture.

14. A bonding layer structure, comprising:

an electrostatic chuck having a first aperture formed therethrough;

a temperature control base having a second aperture formed therethrough, wherein the second aperture comprises a third diameter and a fourth diameter different from the third diameter;

a bonding layer disposed between the electrostatic chuck and the temperature control base, the bonding layer comprising:

a first bonding layer adhered to the electrostatic chuck and having a first opening extending through the first bonding layer; and a second bonding layer adhering directly to the first bonding layer and the temperature control base and having a second opening extending through the second bonding layer, wherein the second opening has a second diameter greater than a first diameter of the first opening; and a porous plug disposed adjacent to the bonding layer.

15. The bonding layer structure of claim 14, wherein the fourth diameter of the temperature control base is smaller than the third diameter of the temperature control base.

16. The bonding layer of claim 14, wherein the second diameter of the second opening of the second bonding layer is substantially equal to or greater than the third diameter of the temperature control base.

17. The bonding layer of claim 14, wherein the first diameter of the first opening of the first bonding layer is substantially equal to the third diameter of the temperature control base.

18. The bonding layer structure of claim 14, wherein the bonding layer comprises an organic material.

19. The bonding layer structure of claim 14, wherein the bonding layer comprises an inorganic material.

20. The bonding layer structure of claim 14, wherein centers of the first aperture, the second aperture, the first opening, and the second opening are aligned along an axis extending therethrough.

* * * * *